United States Patent
Shih et al.

(10) Patent No.: US 12,266,564 B2
(45) Date of Patent: Apr. 1, 2025

(54) SEMICONDUCTOR DEVICE

(71) Applicant: NANYA TECHNOLOGY CORPORATION, New Taipei (TW)

(72) Inventors: Chiang-Lin Shih, New Taipei (TW); Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 504 days.

(21) Appl. No.: 17/585,428

(22) Filed: Jan. 26, 2022

(65) Prior Publication Data

US 2023/0238277 A1 Jul. 27, 2023

(51) Int. Cl.
  *H01L 21/768* (2006.01)
  *H01L 23/522* (2006.01)
  *H10B 12/00* (2023.01)

(52) U.S. Cl.
  CPC .... *H01L 21/7682* (2013.01); *H01L 21/76877* (2013.01); *H01L 21/76897* (2013.01); *H01L 23/5226* (2013.01); *H10B 12/0335* (2023.02)

(58) Field of Classification Search
  None
  See application file for complete search history.

(56) References Cited

U.S. PATENT DOCUMENTS

| | | | |
|---|---|---|---|
| 11,626,287 B2* | 4/2023 | Park | H01L 23/485 257/384 |
| 11,854,883 B2* | 12/2023 | Lin | H01L 21/76805 |
| 11,917,837 B2* | 2/2024 | Chiu | H10N 70/24 |
| 11,980,036 B2* | 5/2024 | Wu | H10B 51/30 |
| 2020/0373165 A1* | 11/2020 | Park | H01L 29/41791 |
| 2023/0255119 A1* | 8/2023 | Yang | H10N 50/01 257/421 |
| 2024/0145304 A1* | 5/2024 | Lin | H01L 23/535 |

\* cited by examiner

*Primary Examiner* — Long Pham
(74) *Attorney, Agent, or Firm* — CKC & Partners Co., LLC

(57) ABSTRACT

A semiconductor device includes a device layer with a semiconductor element, a first dielectric layer on the device layer, a first conductive line on the device layer and surrounded by the first dielectric layer, and a second dielectric layer on the first dielectric layer and around the first conductive line. The semiconductor includes a spacer disposed on the first conductive line and abutting a sidewall of the second dielectric layer, and a first conductive via disposed on the first conductive line and the spacer. The first conductive via includes a first segment positioned over the spacer and including a first width, and a second segment positioned between the first segment the first conductive line and including a second width. The first width is larger than the second width.

10 Claims, 15 Drawing Sheets

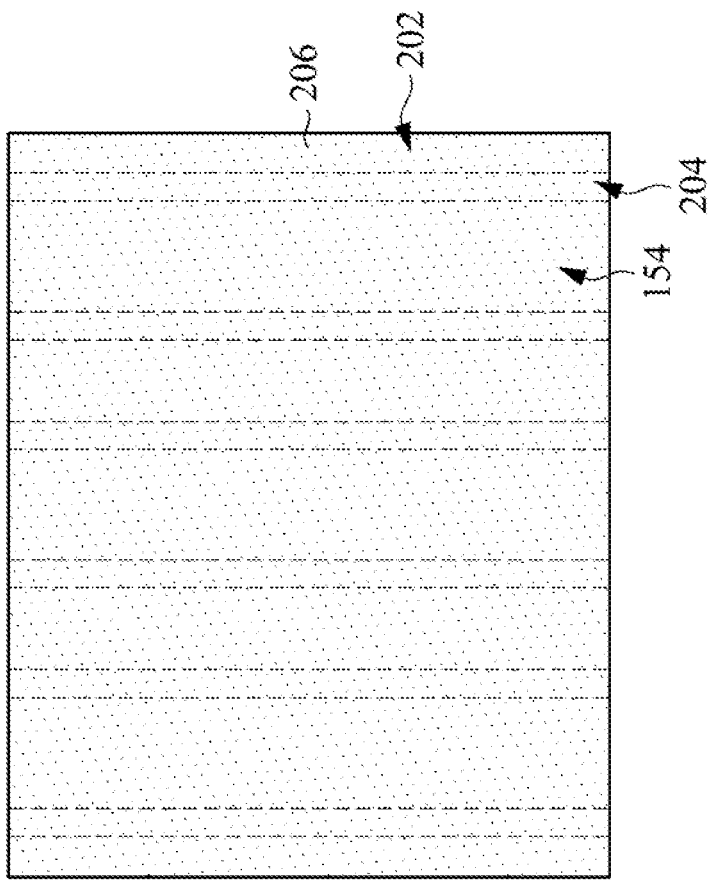
Fig. 7B
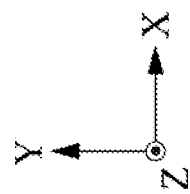

SEMICONDUCTOR DEVICE

BACKGROUND

Field of Invention

The present disclosure relates to a semiconductor device.

Description of Related Art

Smaller and lighter electronics devices have driven semiconductor devices such as dynamic random access memory (DRAM) shrunk with a high degree of integration. Thus, a distance between elements within the semiconductor device has gradually decreased. For example, functional density (i.e., the number of interconnected devices per area) has generally increased while geometric size (i.e., the smallest component (or line) that can be created using a fabrication process) has decreased. This scaling down process generally provides benefits by increasing production efficiency and lowering associated costs.

However, these advances of scaling down have increased the complexity of processing and manufacturing semiconductor devices. Since sizes continue to decrease, fabrication processes continue to become more difficult to perform. Therefore, it is a challenge to fabricate reliable semiconductor devices at smaller and smaller sizes.

SUMMARY

An aspect of the present disclosure provides a semiconductor device. The semiconductor device includes a device layer with a semiconductor element, a first dielectric layer on the device layer, a first conductive line on the device layer and surrounded by the first dielectric layer, a second dielectric layer on the first dielectric layer and around the first conductive line, a spacer disposed on the first conductive line and abutting a sidewall of the second dielectric layer, and a first conductive via disposed on the first conductive line and the spacer. An upper surface of the second dielectric layer is higher than an upper surface of the first conductive line. The first conductive via includes a first segment positioned over the spacer and including a first width, and a second segment positioned between the first segment the first conductive line and including a second width. The first width is larger than the second width.

An aspect of the present disclosure provides a method for fabricating the semiconductor device. The method for fabricating the semiconductor device includes disposing a first dielectric layer on a device layer which includes a semiconductor element, disposing a second dielectric layer on the first dielectric layer, forming a first opening in the first dielectric layer and the second dielectric layer, and forming a conductive line in the first opening. An upper surface of the second dielectric layer is higher than an upper surface of the conductive line. The method for fabricating the semiconductor device further includes forming a spacer on the conductive line and in a remaining portion of the first opening. The spacer partially covers the conductive line. The method for fabricating the semiconductor device further includes disposing a third dielectric layer on the conductive line and the second dielectric layer. An etching selectivity of the third dielectric is different from an etching selectivity of the spacer. The method for fabricating the semiconductor device further includes forming a second opening in the third dielectric layer. A width of the second opening is larger than a width of the conductive line. The method for fabricating the semiconductor device further includes forming a conductive via by filling the second opening with a conductive material.

The present disclosure discloses various embodiments to provide a semiconductor device and a method for fabricating thereof. With spacer, the reliability of the semiconductor device can be enhanced, and the fabrication processes of a conductive via onto a conductive line inside the semiconductor device can be simplified.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 7B is a top view of a semiconductor device shown in FIG. 7A according to some embodiments of the present disclosure.

DETAILED DESCRIPTION

Figure 1:
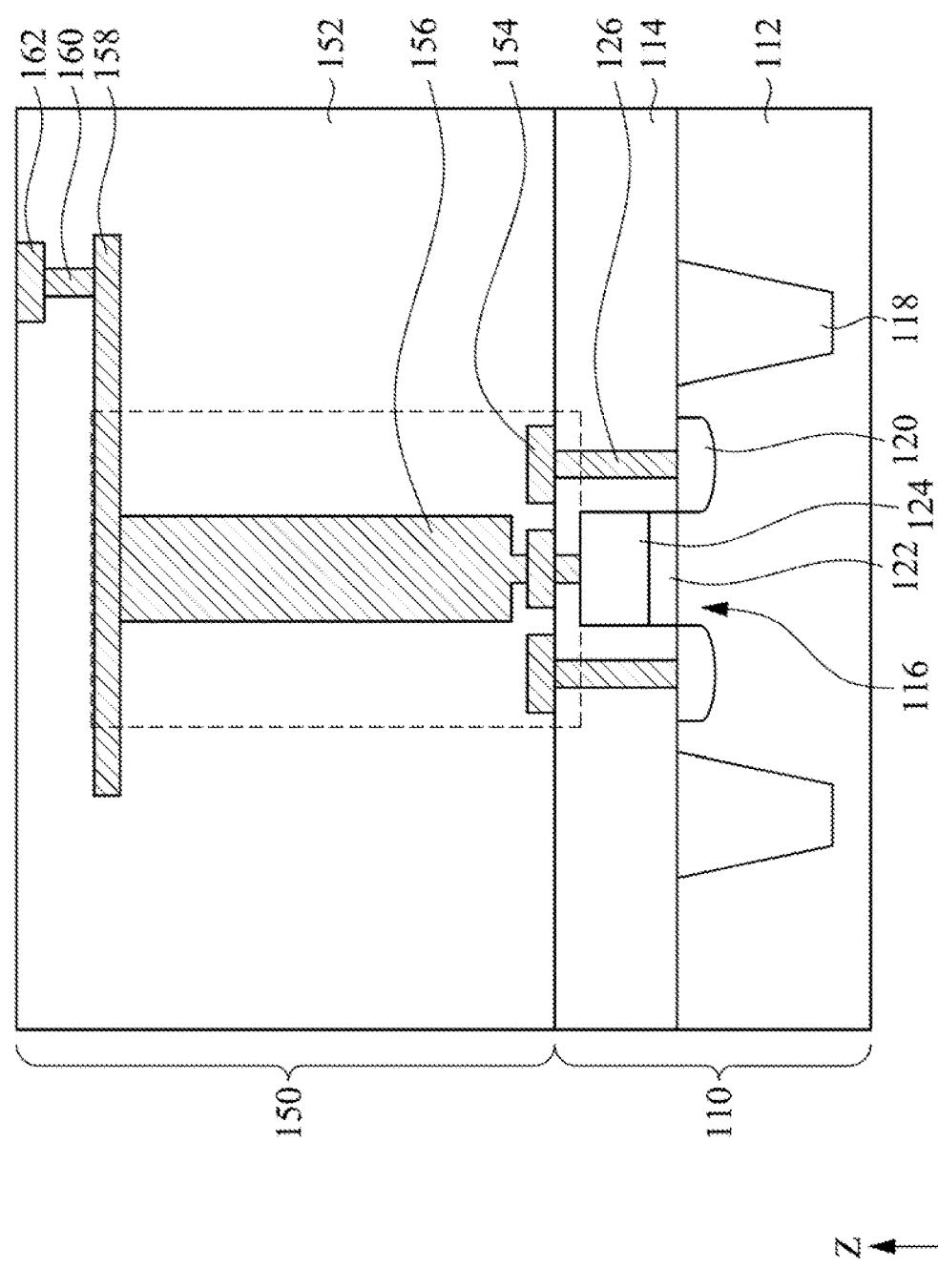
FIG. 1 is cross-sectional view of a semiconductor device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the semiconductor device has shrunk with a high degree of integration, a distance between elements and the sizes of the elements within the semiconductor device has gradually decreased. For example, density of conductive lines for interconnecting elements has generally increased while the width and the pitch of the conductive lines have decreased. As a result, it is difficult to fabricate a conductive via onto a certain conductive line with a reduced width in a close arrangement. Especially in dynamic random access memory (DRAM), a conductive via in the same dielectric structure as a storage node structure (e.g., capacitor) disposed in tends to include a larger height due to the design of the storage node structure, further increasing the difficulty in fabricating a reliable semiconductor device. Thus, various embodiments of the present disclosure provide a semiconductor device and a method for fabricating thereof.

Referring to FIG. 1, FIG. 1 is cross-sectional view of a semiconductor device 100 according to some embodiments of the present disclosure. The semiconductor device 100 may include a device layer 110 and an interconnect structure 150 disposed on the device layer 110.

In FIG. 1, the device layer 110 can include a substrate 112, an interlayer dielectric (ILD) layer 114 and a semiconductor element 116. The interlayer dielectric layer 114 may be disposed on the substrate 112, and the semiconductor element 116 may be disposed both in the substrate 112 and the interlayer dielectric layer 114.

In some embodiments, the substrate 112 can be a semiconductor material. In some embodiments, the substrate 112 may be or include a silicon substrate. The substrate 112 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The interlayer dielectric layer 114 is disposed over the semiconductor element 116 and the substrate 112. The interlayer dielectric layer 114 can include one or more stacked interlayer dielectric layers, which may respectively have a low-k dielectric (e.g., a dielectric material with a dielectric constant less than about 3.9), an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like.

The semiconductor element 116 is disposed in the device layer 110. In an example as shown in FIG. 1, the semiconductor element 116 includes a pair of source/drain regions 120, a gate dielectric 122, and a gate electrode 124. The pair of source/drain regions 120 are regions of the substrate 112 having a specific doping type (e.g., n-type).

The gate dielectric 122 is disposed over the substrate 112 and between the source/drain regions of the pair of source/drain regions 120. The gate electrode 124 overlies the gate dielectric 122. In some embodiments, the gate dielectric 122 and the gate electrode 124 are collectively referred to as a gate stack. In some embodiments, the gate electrode 124 can include polysilicon. In such embodiments, the gate dielectric 122 can include, for example, an oxide (e.g., silicon dioxide (SiO2). In other embodiments, the gate electrode 124 can include a metal, such as aluminum (Al), copper (Cu), titanium (Ti), tantalum (Ta), tungsten (W), molybdenum (Mo), cobalt (Co), or the like. In such embodiments, the gate dielectric 122 can include a high-k dielectric material (e.g., a dielectric material with a dielectric constant higher than about 3.9), such as hafnium oxide (HfO), tantalum oxide (TaO), hafnium silicon oxide (HfSiO), hafnium tantalum oxide (HfTaO), aluminum oxide (AlO), zirconium oxide (ZrO), or the like.

It is noted that despite the fact that the semiconductor element 116 is illustrated as a planar field-effect transistors with the gate electrode 124 on the substrate 112, other types of field-effect transistor, such as a buried channel array transistor with a gate electrode buried in a substrate, are within the scope and spirit of this disclosure.

Multiple conductive contacts 126 are disposed on the semiconductor element 116. Particularly, each conductive contact 126 is respectively electrically coupled to each source/drain region 120 and the gate electrode 124. In some embodiments, the conductive contacts 126 may include tungsten (W), copper (Cu), aluminum (Al), or the like.

Multiple isolation structures 118 are formed and embedded in the substrate 112 to electrically isolate the semiconductor element 116. The isolation structures 118 may include an oxide (e.g., $SiO_2$), a nitride (e.g., SiN), an oxy-nitride (e.g., SiON), other suitable dielectric material, or a combination thereof.

The interconnect structure 150 disposed on the device layer 110 may be embedded in a dielectric structure 152 which is disposed on the interlayer dielectric layer 114. The interconnect structure 150 is configured to provide electrical connections between various electrical components such as the source/drain regions 120, the gate dielectric 122, and the gate electrode 124 in the semiconductor element 116. Therefore, the interconnect structure 150 can include a first conductive line 154, a first conductive via 156, a second conductive line 158, a second conductive via 160, and a third conductive line 162.

The conductive contacts 126 in the device layer 110 and the first conductive line 154, the first conductive via 156, the second conductive line 158, the second conductive via 160, and the third conductive line 162 in the interconnect structure 150 can be electrically coupled together in a predefined manner to provide electrical connections between various electrical components. In some embodiments, the first conductive line 154 and the first conductive via 156 are electrically connected to the semiconductor element 116 through the conductive contacts 126.

In some embodiments, the first conductive line 154, the first conductive via 156, the second conductive line 158, the second conductive via 160, and the third conductive line 162 in the interconnect structure 150 may include metal such as tungsten (W), copper (Cu), aluminum (Al), gold (Au), silver (Ag), platinum (Pt), or the like. In some other embodiments, the first conductive via 156 in the interconnect structure 150 may include polysilicon.

In a case where the semiconductor device 100 is fabricated as a DRAM, a longitudinal distance (e.g., along the Z direction) between the first conductive line 154 and the second conductive line 158 may be larger than a longitudinal distance (e.g., along the Z direction) between the second conductive line 158 and the third conductive line 162. In other words, a height (e.g., a dimension along the Z direction) of the first conductive via 156 is larger than a height (e.g., a dimension along the Z direction) of the second conductive via 160. In some embodiments, a ratio of the height of the first conductive via 156 to the height of the second conductive via 160 can be larger than about 5. For example, the ratio of the height of the first conductive via 156 to the height of the second conductive via 160 can be about 5, 10, or 15, but the present disclosure is not limited thereto. In some embodiments, the height of the first conductive via 156 can be between about 1 μm and about 3 μm. In some further embodiments, the height of the first conductive via 156 can be between about 1.5 μm and about 3 μm, for example 1.5 μm, 2.0 μm, 2.5 μm or 3 μm, but the present disclosure is not limited thereto. An arrangement of the interconnect structure 150 in the dielectric structure 152 is further illustrated in the following FIG. 2.

Figure 2:
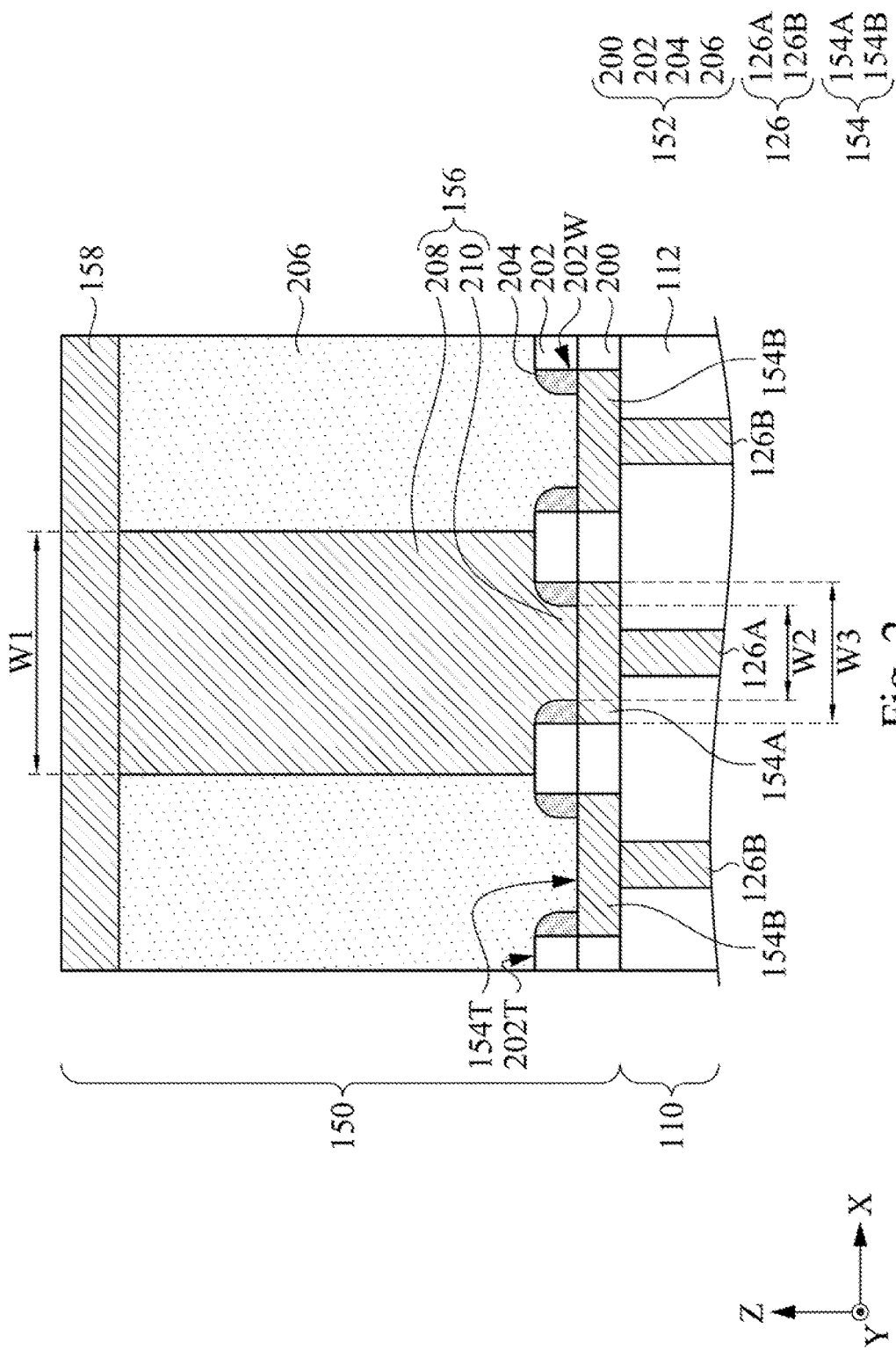
FIG. 2 is an enlarged view of a portion of a semiconductor device shown in FIG. 1 according to some embodiments of the present disclosure.

Referring to FIG. 2, FIG. 2 is an enlarged view of a portion of the semiconductor device 100 indicated with broken lines in FIG. 1 according to some embodiments of the present disclosure. The dielectric structure 152 can include a first dielectric layer 200 disposed on the device layer 110, a second dielectric layer 202 disposed on the first dielectric layer 200, a spacer 204 abutting on a sidewall 202W of the second dielectric layer 202, and a third dielectric layer 206 disposed on the second dielectric layer 202.

Particularly, the first dielectric layer 200 and the first conductive line 154 can be alternately arranged in the X direction. In the cross-sectional view of FIG. 2, two adjacent first conductive lines 154 can be spaced apart from each other by the first dielectric layer 200. In other words, the first conductive line 154 can be disposed on the device layer 110 and surrounded by the first dielectric layer 200. The second dielectric layer 202 is disposed on the first dielectric layer 200 and around the first conductive line 154 accordingly. In some embodiments, an upper surface 202T of the second dielectric layer 202 is higher than an upper surface 154T of the first conductive line 154. The spacer 204 is disposed on the first conductive line 154 and against a sidewall 202W of the second dielectric layer 202. In such embodiment, the spacer 204 can cover a portion of the first conductive line 154.

The first conductive via 156 can be disposed on the first conductive line 154, the second dielectric layer 202 and the spacer 204. The third dielectric layer 206 may surround the first conductive via 156 to provide the function of electric isolation and be disposed on the first conductive line 154, the second dielectric layer 202 and the spacer 204. In the cross-sectional view of FIG. 2, the first conductive line 154 and the conductive contact 126 that the first conductive via 156 is disposed on and electrically connected to can be regarded as a first conductive line 154A and a conductive contact 126A respectively; on the other hands, the first conductive line 154 and the conductive contact 126 that the third dielectric layer 206 is disposed on can be regarded as a first conductive line 154B and a conductive contact 126B respectively.

It is noted that, in some other embodiments with different cross-section views (i.e., different XZ planes spaced at intervals along the Y direction), an additional first conductive via (not shown herein) may be disposed on and electrically connected to the first conductive line 154B and the conductive contact 126B, and the third dielectric layer 206 may be disposed on and cover the first conductive line 154A. In other words, the first conductive via 156 and the aforementioned additional first conductive via (not shown herein) can be spaced apart from each other not only in the X direction but also in the Y direction.

The first conductive via 156 can include two segments in the Z direction: a first segment 208 and a second segment 210. The first segment 208 can be positioned over the spacer 204, and the second segment 210 can be positioned between the first segment 208 and the first conductive line 154 (e.g., the first conductive line 154A shown in the cross-section view of FIG. 2).

The first segment 208 includes a first width W1, and the second segment includes a second width W2. The first width W1 is larger than the second width W2. In some embodiments, a projection of the second segment 210 on the device layer 110 can be inside a projection of the first segment 208 on the device layer 110.

The first conductive line 154 includes a third width W3. In some embodiments, the first width W1 can be designed to be larger than the third width W3. Therefore, a projection of the first conductive line 154 on the device layer 110 can be inside a projection of the first segment 208 on the device layer 110. The larger first width W1 can allow the process of fabricating the first conductive via 156 to be smoother, which is further described later in fabrication stages. In such embodiment, a ratio of the first width W1 to the third width W3 is in a range from 1.2 to 1.5. If the ratio of the first width W1 to the third width W3 is below the above-noted lower limit, the process of fabricating the first conductive via 156 may not be improved. If the ratio of the first width W1 to the third width W3 is beyond the above-noted upper limit, no obvious advantage is achieved. For example, the shrinkage of the design rule may not be effectively achieved. In some other embodiments, the first width W1 can be substantially the same as the third width W3.

Further, due to the spacer 204, the second width W2 is smaller than the third width W3, implying the second width W2 has a negative correlation to a thickness of the spacer 204. That is, the spacer 204 may be thinner as the second width W2 is larger. Because the spacer 204 can serve as protection for the first dielectric layer 200 and the first conductive line 154 during the fabrication processes to eliminate a risk of short circuit, a ratio of the second width W2 to the third width W3 is in a range from 0.5 to 0.8 in some embodiments. If the ratio of the second width W2 to the third width W3 is below the above-noted lower limit, the process of fabricating the first conductive via 156 (e.g., the second segment 210) may become more difficult. Further, a contact resistance (Rc) of the first conductive via 156 may be increased due to a reduced contact area. If the ratio of the second width W2 to the third width W3 is beyond the above-noted upper limit, the spacer 204 may not be thick enough for protection and therefore a risk of short circuit in the semiconductor device 100 may increase.

FIG. 3, FIG. 4A, FIG. 5A, FIG. 6A, FIG. 7A, FIG. 8A and FIG. 9A are cross-sectional views at various stages of fabricating the semiconductor device 100 shown in FIG. 2 according to some embodiments of the present application. Various operations of embodiments are provided herein. The order in which some or all of the operations are described should not be construed to imply that these operations are necessarily order dependent. Alternative ordering will be appreciated having the benefit of this description. Additional operations can be provided before, during, and/or after these operations, and may be briefly described herein. Further, it will be understood that not all operations are necessarily present in each embodiment provided herein. Also, it will be understood that not all operations are necessary in some embodiments. FIG. 4B, FIG. 5B, FIG. 6B, FIG. 7B, FIG. 8B and FIG. 9B are top views of the structure shown in FIG. 4A, FIG. 5A, FIG. 6A, FIG. 7A, FIG. 8A and FIG. 9A respectively.

Figure 3:
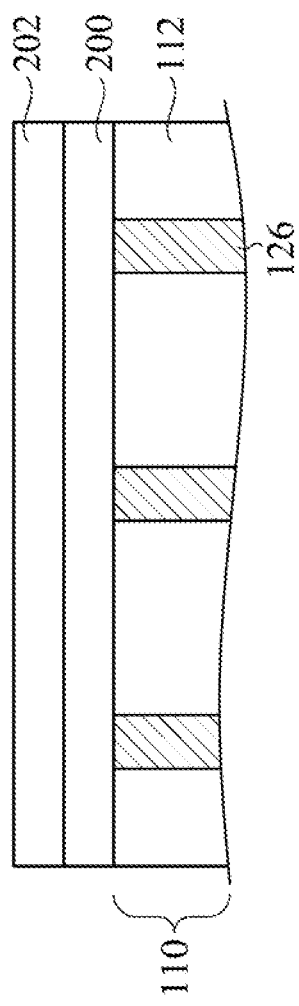
FIG. 3 is a cross-sectional view of a semiconductor device at one of various stages of fabricating a semiconductor device according to some embodiments of the present disclosure.

Referring to FIG. 3, FIG. 3 illustrates an operation of disposing the first dielectric layer 200 on a device layer 110 and then disposing the second dielectric layer 202 on the first dielectric layer 200. In some embodiments, a material of the second dielectric layer 202 can be different from a material of the first dielectric layer 200. In some further embodiments, an etching selectivity of the second dielectric layer 202 can be different from an etching selectivity of the first dielectric layer 200. The first dielectric layer 200 can include an oxide (e.g., $SiO_2$), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), or the like. The second dielectric layer 202 can include a nitride (e.g., SiN), an oxy-nitride (e.g., SiON), or the like.

Figure 4A:
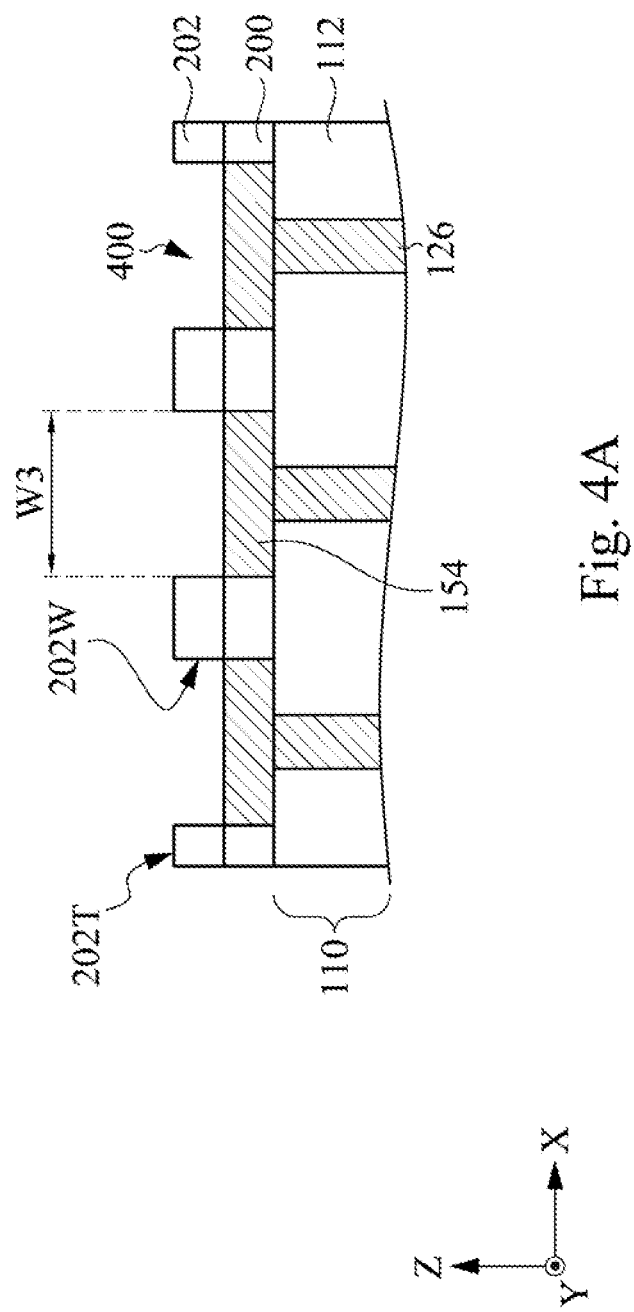
FIG. 4A is a cross-sectional view of a semiconductor device at one of various stages of fabricating a semiconductor device according to some embodiments of the present disclosure.
Figure 4B:
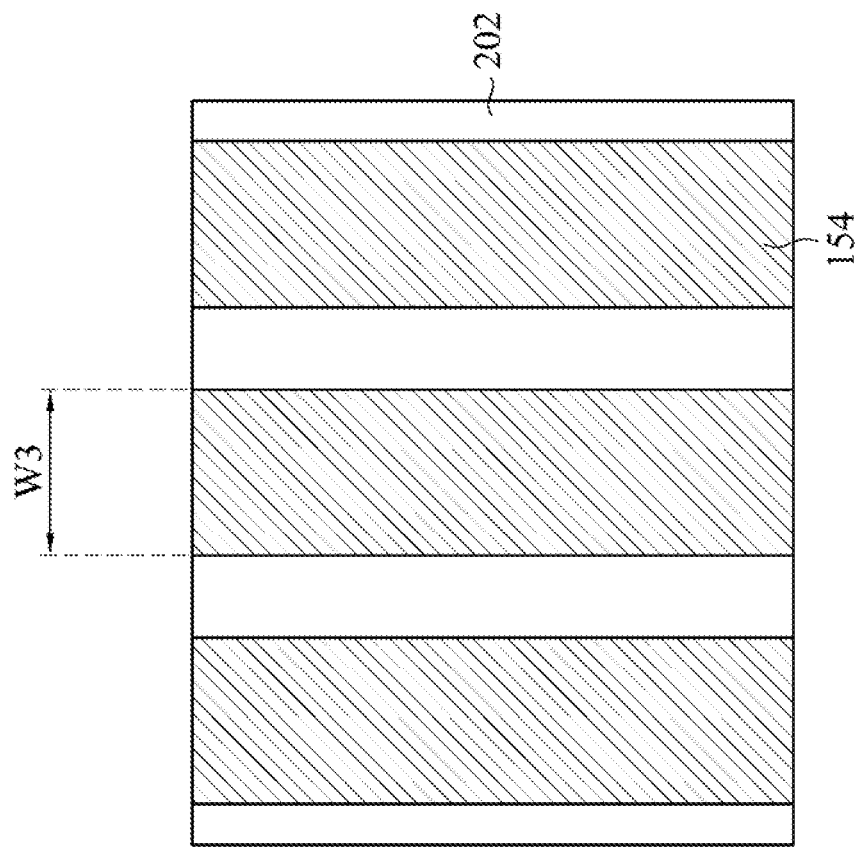
FIG. 4B is a top view of a semiconductor device shown in FIG. 4A according to some embodiments of the present disclosure.

Referring to FIG. 4A and FIG. 4B, FIG. 4A and FIG. 4B illustrate an operation of forming a first opening 400 in the first dielectric layer 200 and the second dielectric layer 202, and then forming the first conductive line 154 in the first opening 400. A formation of the first opening 400 can include patterning the second dielectric layer 202 through a resist pattern (not shown herein) disposed thereon, and patterning the first dielectric layer 200 through the second dielectric layer 202 as a hard mask. A formation of the first conductive line 154 in the first opening 400 can includes depositing a metal material (not shown herein) to overfill the first opening 400, performing a planarization process (e.g., chemical mechanical planarization, CMP) to remove excess portions of the conductive material over the upper surface 202T of the second dielectric layer 202, and recessing the leveled metal material.

The first conductive line 154 is formed in the first dielectric layer 200 and the second dielectric layer 202 with the upper surface 154T lower than the upper surface 202T of the second dielectric layer 202. Since the first conductive line 154 can be formed by filling the first opening 400 with a metal material (not shown herein), the third width W3 of the first conductive line 154 can be adjusted by a dimension of the first opening 400.

Figure 5A:
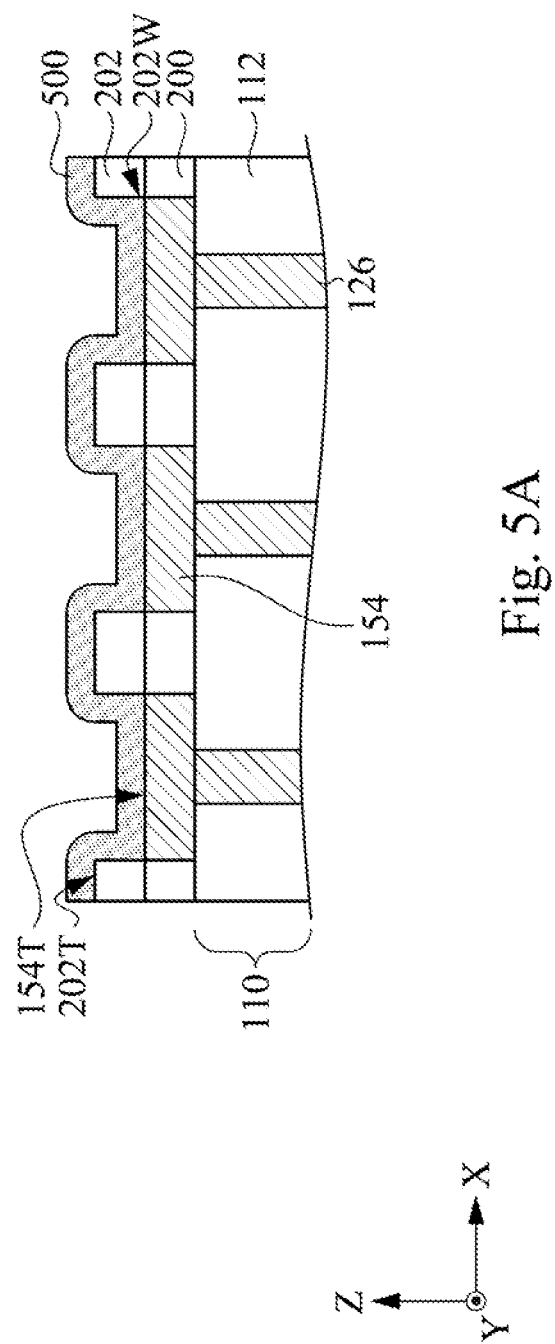
FIG. 5A is a cross-sectional view of a semiconductor device at one of various stages of fabricating a semiconductor device according to some embodiments of the present disclosure.
Figure 5B:
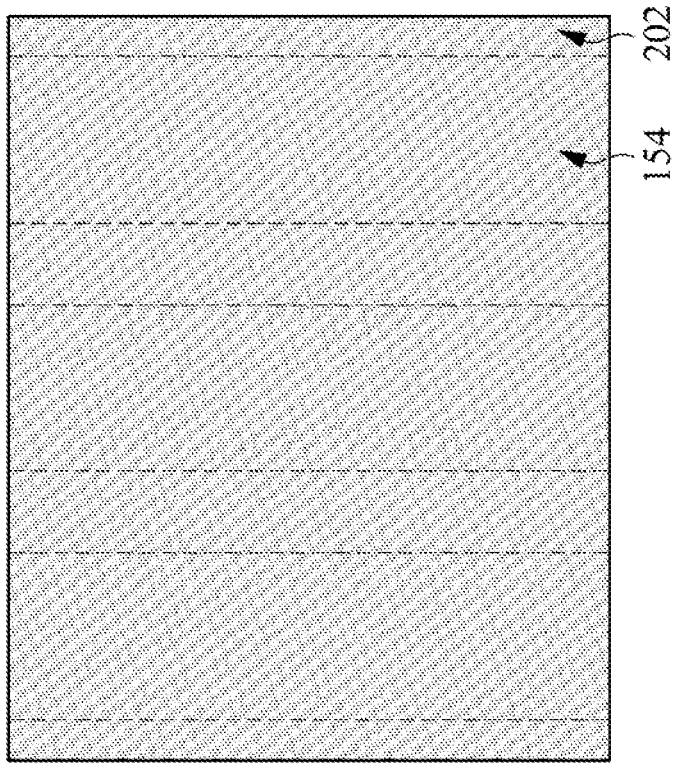
FIG. 5B is a top view of a semiconductor device shown in FIG. 5A according to some embodiments of the present disclosure.

Referring to FIG. 5A and FIG. 5B, FIG. 5A and FIG. 5B illustrate an operation of depositing a spacer material 500 on the first conductive line 154 and the second dielectric layer 202. The spacer material 500 is deposited along a collective profile of the first conductive line 154 and the second dielectric layer 202. Thus, a profile of the spacer material 500 may be similar to the collective profile of the first conductive line 154 and the second dielectric layer 202. In such embodiment, the spacer material 500 can include a lateral portion (reference number not shown) and a vertical portion (reference number not shown). The lateral portion is on the upper surface 154T of the first conductive line 154 and the upper surface 202T of the second dielectric layer 202. The vertical portion abuts the sidewall 202W of the second dielectric layer 202. In some embodiments, the spacer material 500 may fill a remaining portion of the first opening 400 (referring to FIG. 4A).

A material of the spacer material 500 is selected to be different from a material of the first dielectric layer 200. In some embodiments, an etching selectivity of the spacer material 500 can be different from an etching selectivity of the first dielectric layer 200. In some embodiments, a material of the spacer material 500 may be similar to a material of the second dielectric layer 202. For example, the spacer material 500 can include a nitride (e.g., SiN), an oxy-nitride (e.g., SiON), or the like. In some further embodiments, a material of the spacer material 500 and a material of the second dielectric layer 202 may be the same.

Figure 6A:
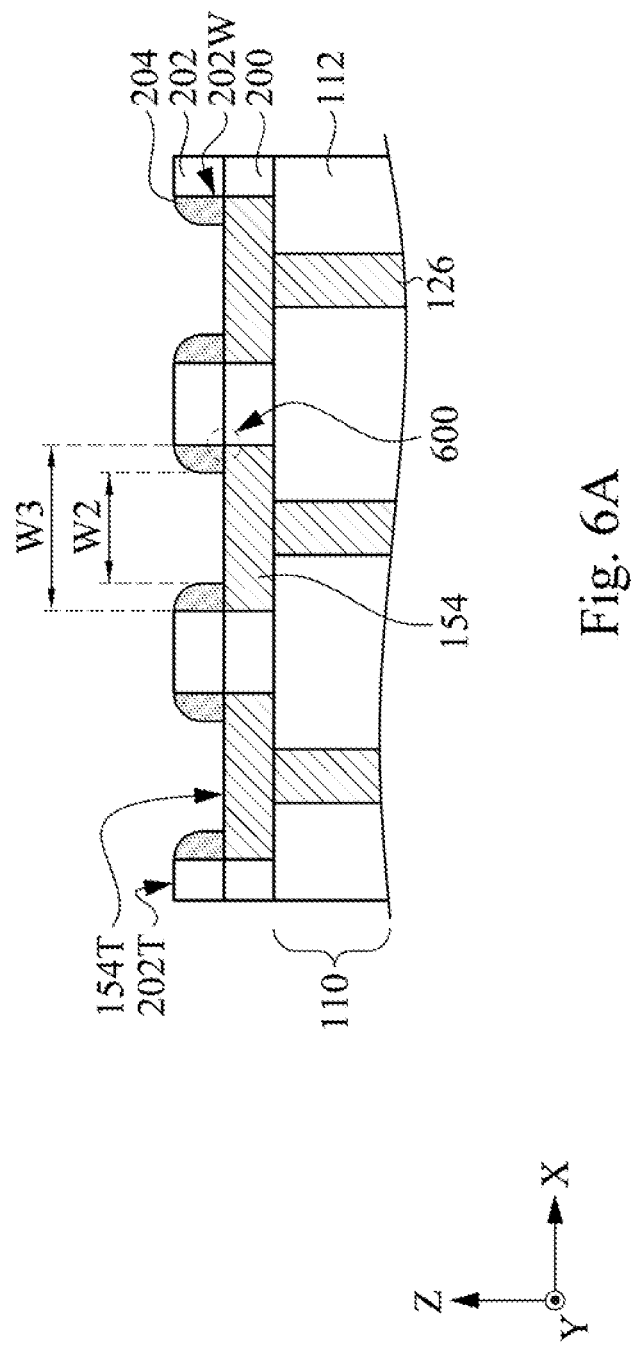
FIG. 6A is a cross-sectional view of a semiconductor device at one of various stages of fabricating a semiconductor device according to some embodiments of the present disclosure.
Figure 6B:
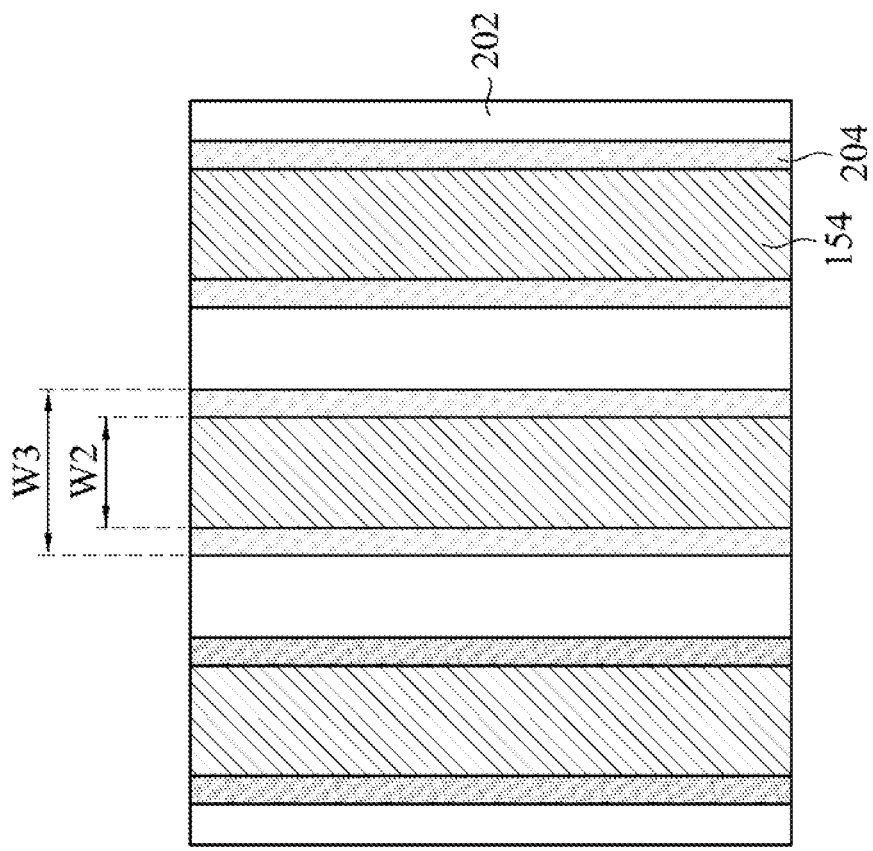
FIG. 6B is a top view of a semiconductor device shown in FIG. 6A according to some embodiments of the present disclosure.

Referring to FIG. 6A and FIG. 6B, FIG. 6A and FIG. 6B illustrate an operation of removing the lateral portion of the spacer material 500 to form the spacer 204 on the first conductive line 154 and in a remaining portion of the first opening 400 (referring to FIG. 4A). In other words, the vertical portion is remained and becomes the spacer 204 after removing the lateral portion of the spacer material 500. Without the lateral portion, one part of the first conductive line 154 is exposed between two adjacent spacers 204 facing to each other, and the other part of the first conductive line 154 near the sidewall 202W is covered by the spacer 204. Accordingly, an exposing area of the first conductive line 154 may include the second width W2 which is smaller than a line width (i.e., the third width W3) of the first conductive line 154. In other words, a distance between two face-to-face spacers 204 can be substantially equal to the second width W2.

In addition, the spacer 204 can keep covering the sidewall 202W of the second dielectric layer 202. Therefore, the spacer 204 may cover a corner 600 of the second dielectric layer 202 and the first conductive line 154 as shown in FIG. 6A.

Since the spacer 204 is formed by removing portions of the spacer material 500, a material of the spacer 204 is basically identical to a material of the spacer material 500 as described previously. Therefore, no further description is elaborated herein.

Figure 7A:
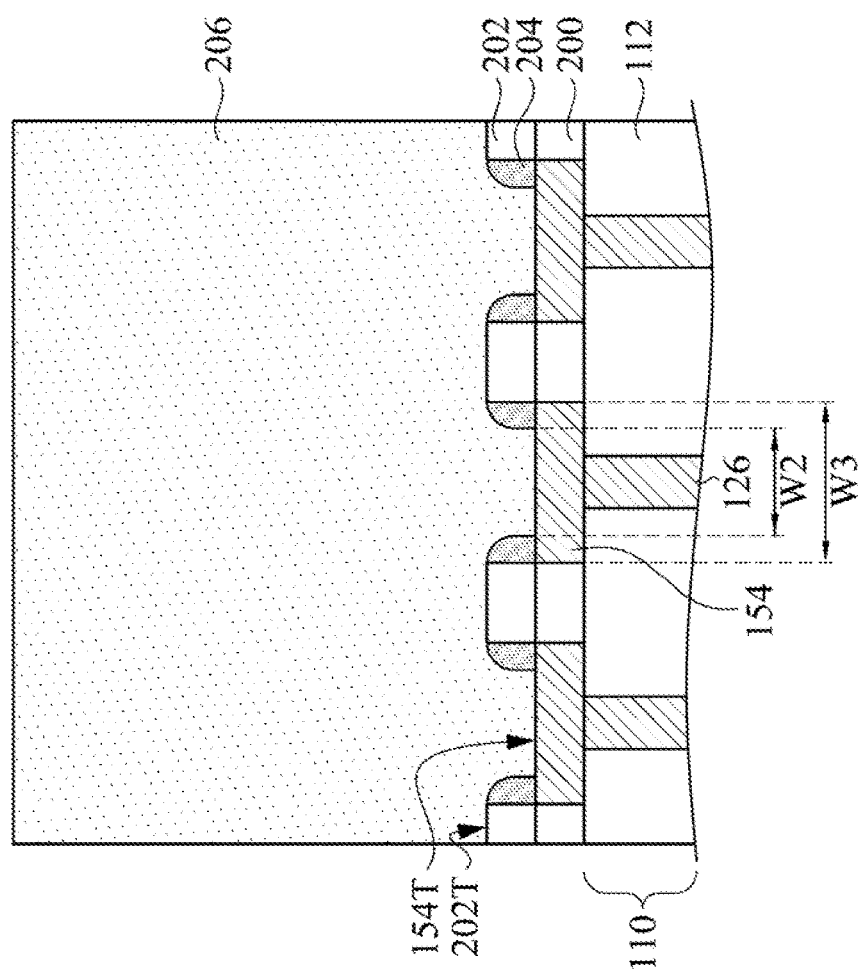
FIG. 7A is a cross-sectional view of a semiconductor device at one of various stages of fabricating a semiconductor device according to some embodiments of the present disclosure.

Referring to FIG. 7A and FIG. 7B, FIG. 7A and FIG. 7B illustrate an operation of disposing the third dielectric layer 206 on the first conductive line 154 and the second dielectric layer 202. A material of the third dielectric layer 206 is selected to be different from a material of the spacer 204, a material of the second dielectric layer 202 and a material of the first conductive line 154. In some embodiments, an etching selectivity of the third dielectric layer 206 can be different from an etching selectivity of the spacer 204, an etching selectivity of the second dielectric layer 202 and an etching selectivity of the first conductive line 154. The third dielectric layer 206 can include an oxide (e.g., $SiO_2$), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), or the like. In some embodiments, a material of the third dielectric layer 206 may be similar to a material of the first dielectric layer 200. In some further embodiments, a material of the third dielectric layer 206 and a material of the first dielectric layer 200 may be the same.

Figure 8A:
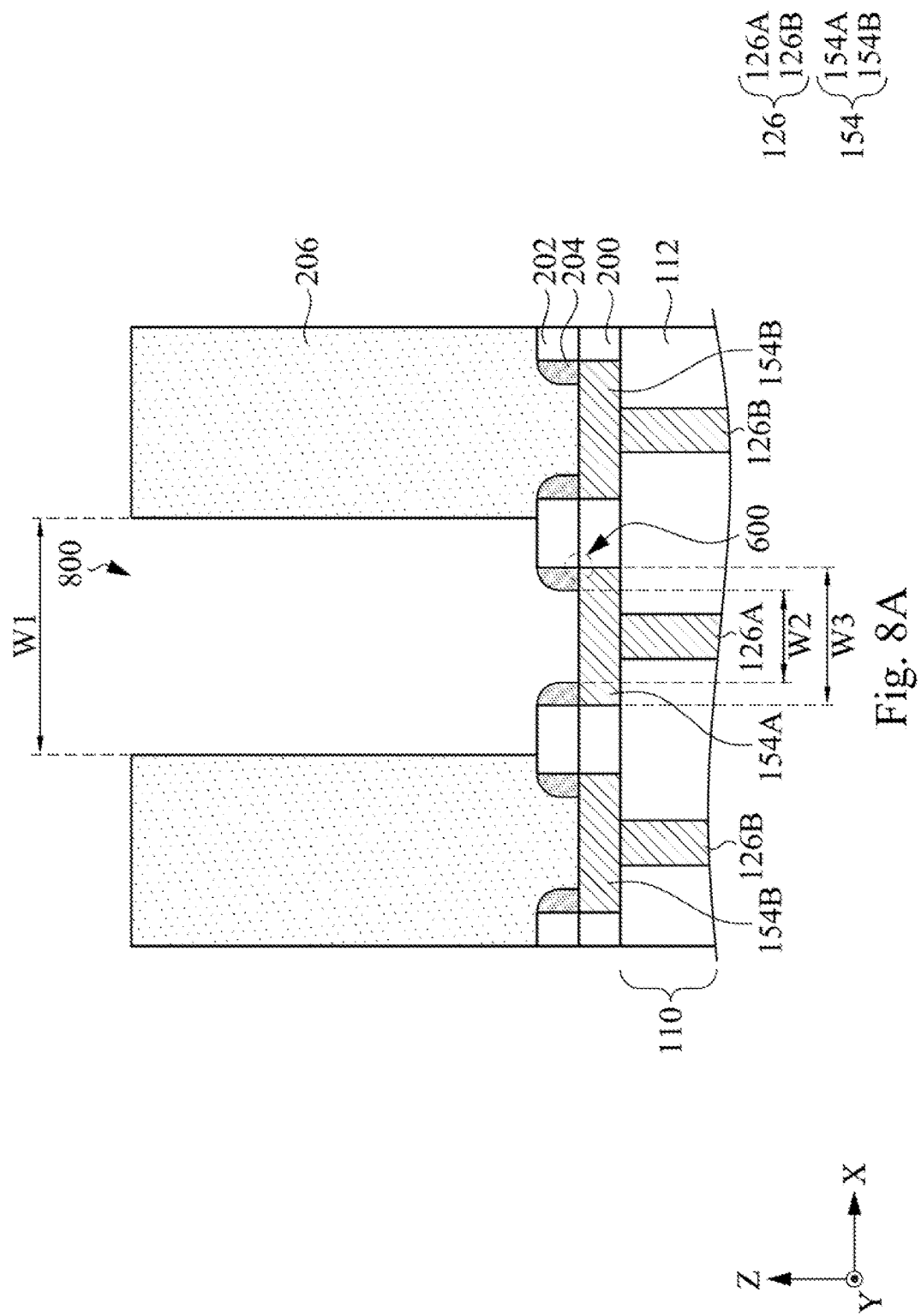
FIG. 8A is a cross-sectional view of a semiconductor device at one of various stages of fabricating a semiconductor device according to some embodiments of the present disclosure.
Figure 8B:
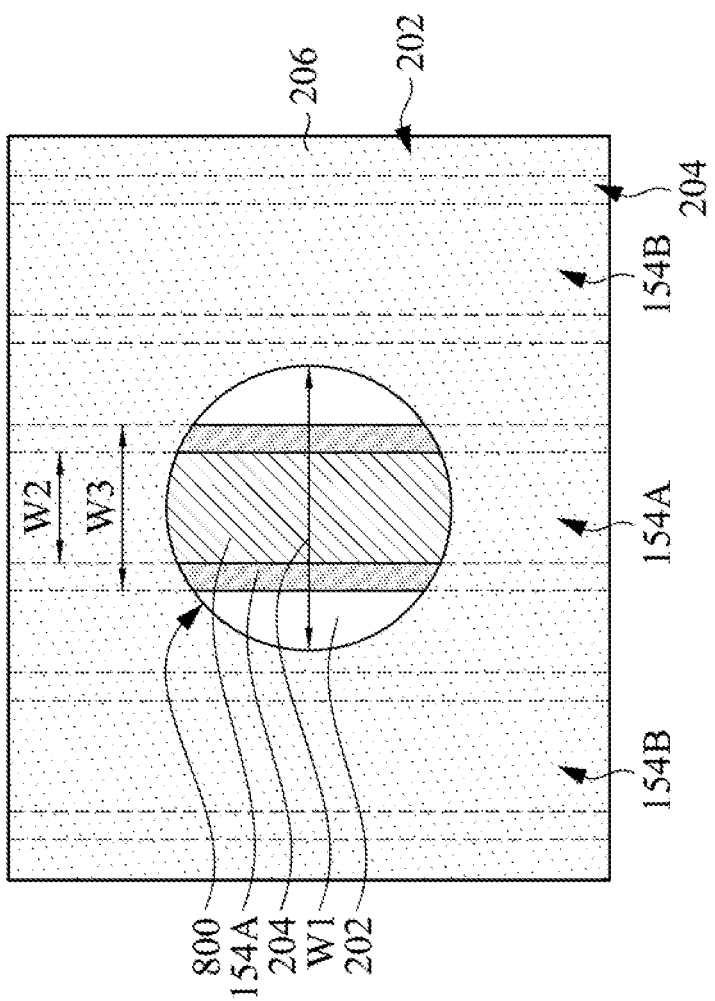
FIG. 8B is a top view of a semiconductor device shown in FIG. 8A according to some embodiments of the present disclosure.

Referring to FIG. 8A and FIG. 8B, FIG. 8A and FIG. 8B illustrate an operation of forming a second opening 800 in the third dielectric layer 206. The second opening 800 may be formed using acceptable photolithography and etching techniques to partially remove the third dielectric layer 206. In some embodiments, the third dielectric layer 206 are removed by an anisotropic dry etch process. For example, the etching process may include a dry etch process using reaction gas(es) that selectively etch the third dielectric layer 206 at a faster rate than the spacer 204, the second dielectric layer 202 and the first conductive line 154. In some embodiments, a width of the second opening 800 may be substantially equal to the first width W1 larger than the second width W2 and the third width W3, so the second opening 800 exposes the first conductive line 154 (e.g., the first conductive line 154A), the spacer 204 and the second dielectric layer 202. In some other embodiments, a width of the second opening 800 may be substantially equal to the third width W3 larger than the second width W2, so the second opening 800 exposes the first conductive line 154 (e.g., the first conductive line 154A) and the spacer 204.

Due to different etching selectivity, both the spacer 204 and the second dielectric layer 202 can protect the first dielectric layer 200 from damage during the removal of the third dielectric layer 206. In particular, the spacer 204 can protect the corner 600 of the second dielectric layer 202 and the first conductive line 154A to ensure the first dielectric layer 200 intact. For example, with the spacer 204 covering the corner 600, etchant(s) during the removal, etchant(s) cannot penetrate the corner 600 and may not contact the first dielectric layer 200. Thus, a reliability of the semiconductor device 100 can be enhanced.

The protection of the spacer 204 can be dependent on its coverage on the first conductive line 154A. Since the coverage of the spacer 204 on the first conductive line 154A is related to the second width W2 and the third width W3, a ratio of the second width W2 to the third width W3 of the first conductive line 154A is in a range from 0.5 to 0.8 in some embodiments. If the ratio of the second width W2 to the third width W3 is below the above-noted lower limit, an operation of filling a gap between two face-to-face spacers 204 may become more difficult. Further, a contact resistance (Rc) of the first conductive via 156 may be increased due to a reduced contact area. If the ratio of the second width W2 to the third width W3 is beyond the above-noted upper limit, the spacer 204 may not be thick enough for protection.

With the protection of the spacer 204, a width of the second opening 800 can be enlarged to simplify the fabrication processes. For example, an alignment between the second opening 800 and the first conductive line 154 or filling the second opening 800 (as a former stage of the first conductive via 156 in FIG. 9A and FIG. 9B) can be simplified.

For example, the second opening 800 having the first width W1 larger than the third width W3 can help the second opening 800 to be form exactly on and to expose the first conductive line 154A, thereby forming the first conductive via 156 exactly on the first conductive line 154A in the later fabrication stages. Moreover, the second opening 800 having the first width W1 larger than the third width W3 can lower an aspect ratio of the second opening 800. In some embodiments, an aspect ratio of the second opening 800 is controlled to be less than about 20 by enlarging the first width W1 of the second opening 800. Therefore, a reduced aspect ratio can facilitate an operation of filling the second opening 800 with a conductive material to form the first conductive via 156 in the later fabrication stages.

In some embodiments, a ratio of the first width W1 to the third width W3 is in a range from 1.2 to 1.5. If the ratio of the first width W1 to the third width W3 is below the above-noted lower limit, an operation of filling the second opening 800 with a conductive material to form the first conductive via 156 in the later fabrication stages may not be improved. If the ratio of the first width W1 to the third width W3 is beyond the above-noted upper limit, no obvious advantage is achieved. For example, the shrinkage of the design rule may not be effectively achieved.

Figure 9A:
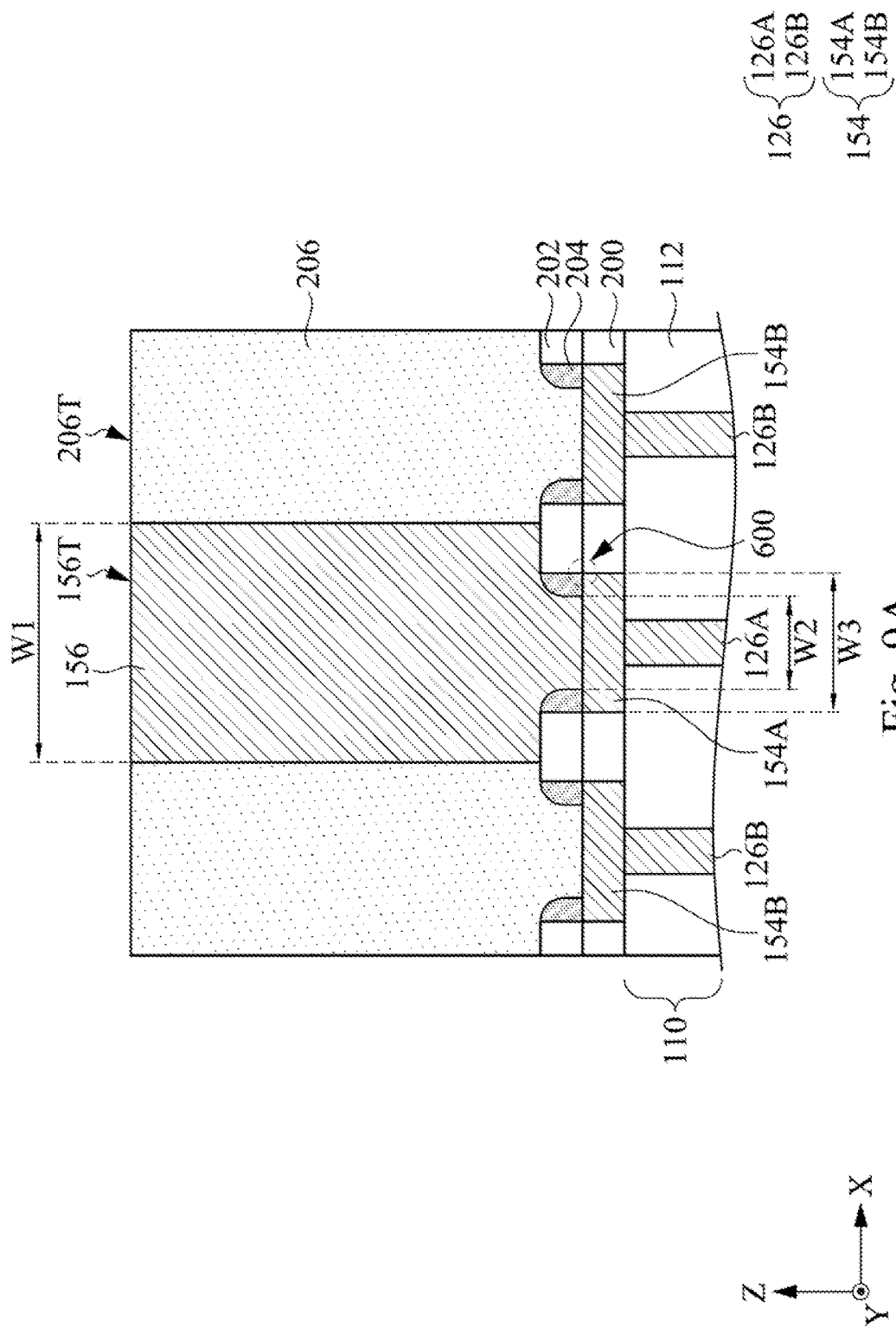
FIG. 9A is a cross-sectional view of a semiconductor device at one of various stages of fabricating a semiconductor device according to some embodiments of the present disclosure.
Figure 9B:
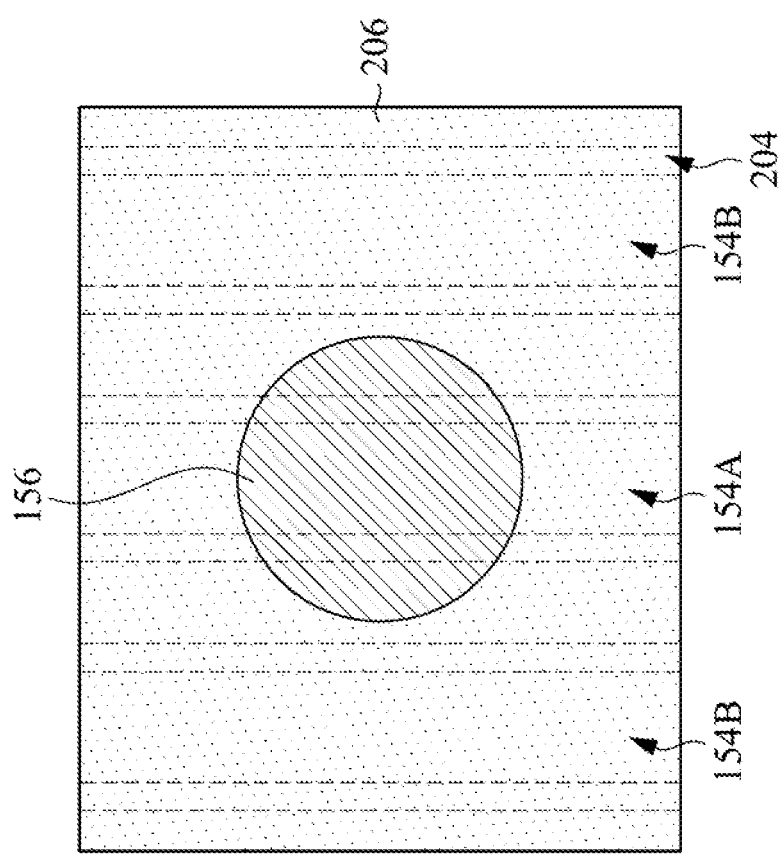
FIG. 9B is a top view of a semiconductor device shown in FIG. 9A according to some embodiments of the present disclosure.

Referring to FIG. 9A and FIG. 9B, FIG. 9A and FIG. 9B illustrate an operation of forming the first conductive via 156 by filling the second opening 800 (referring to FIG. 8) with a conductive material (not shown herein). The second opening 800 with first width W1 can be entirely filled with the conductive material to form the first conductive via 156. That is, no void or no seam can be observed in the first conductive via 156, thereby enhancing the reliability of the semiconductor device 100. In some embodiments, the first conductive via 156 is directly connected to the first conductive line 154A.

Since the spacer 204 covers the corner 600 as well as the first dielectric layer 200 remains intact due to the protection of the spacer 204 during the previous process, no conductive material (not shown herein) can penetrate the corner 600 to contact other electrical component (e.g., another first conductive line 154B in FIG. 9A), thereby decreasing a risk of short circuit. Consequently, the reliability of the semiconductor device 100 can be enhanced.

The conductive material may include metal such as tungsten (W), copper (Cu), aluminum (Al), gold (Au), silver (Ag), platinum (Pt), or the like. In some other embodiments, the conductive material may include polysilicon. A planarization process, such as a CMP, may be performed to remove excess conductive material from an upper surface 206T of the third dielectric layer 206. Therefore, an upper surface 156T of the first conductive via 156 can be coplanar with the upper surface 206T of the third dielectric layer. Subsequently, the second conductive line 158 can be formed on and electrically connected to the first conductive via 156 as shown in FIG. 2.

The present disclosure discloses various embodiments to provide a semiconductor device and a method for fabricating thereof. The semiconductor device includes a conductive line, a conductive via disposed on the conductive line and a spacer therebetween. The spacer can provide protection during the fabrication process of the conductive via, thereby enhancing the reliability of the semiconductor device. In addition, with the spacer, the conductive via disposed on the spacer can have an enlarged width without increasing a risk of short circuit in the semiconductor device. The enlarged width can have benefit to the fabrication processes. For example, filling an opening (as a former stage of the conductive via) to form the conductive via can be simplified.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor device, comprising:
   a device layer comprising a semiconductor element;
   a first dielectric layer on the device layer;
   a first conductive line on the device layer and surrounded by the first dielectric layer;
   a second dielectric layer on the first dielectric layer and around the first conductive line, wherein an upper surface of the second dielectric layer is higher than an upper surface of the first conductive line;
   a spacer disposed on the first conductive line and abutting a sidewall of the second dielectric layer; and
   a first conductive via disposed on the first conductive line and the spacer and in contact with a top surface of the second dielectric layer, wherein the spacer is disposed between the first conductive via and the first conductive line, and disposed between the second dielectric layer and the first conductive via, and the first conductive via comprises:
      a first segment positioned over the spacer and including a first width; and
      a second segment positioned between the first segment and the first conductive line and including a second width, wherein the first width is larger than the second width.

2. The semiconductor device of claim 1, wherein the first conductive line includes a third width, and the first width is larger than the third width.

3. The semiconductor device of claim 2, wherein a ratio of the first width to the third width is in a range from 1.2 to 1.5.

4. The semiconductor device of claim 2, wherein the second width is smaller than the third width.

5. The semiconductor device of claim 4, wherein a ratio of the second width to the third width is in a range from 0.5 to 0.8.

6. The semiconductor device of claim 1, wherein the first conductive line and the first conductive via are electrically connected to the semiconductor element.

7. The semiconductor device of claim 1, further comprising a third dielectric layer disposed on the second dielectric layer and surrounding the first conductive via, wherein an etching selectivity of the third dielectric layer is different from an etching selectivity of the spacer.

8. The semiconductor device of claim 7, wherein a material of the spacer is identical to a material of the second dielectric layer.

9. The semiconductor device of claim 1, further comprising:
   a second conductive line disposed on and electrically connected to the first conductive via;
   a second conductive via disposed on and electrically connected to the second conductive line; and
   a third conductive line disposed on and electrically connected to the second conductive via, wherein a longitudinal distance between the first conductive line and the second conductive line is larger than a longitudinal distance between the second conductive line and the third conductive line.

10. The semiconductor device of claim 1, wherein the first conductive via is directly connected to the first conductive line.

* * * * *